United States Patent
Khor et al.

(10) Patent No.: US 8,687,755 B1
(45) Date of Patent: Apr. 1, 2014

(54) INTERPOLATOR-BASED CLOCK AND DATA RECOVERY WITH REDUCED QUANTIZATION ERROR

(75) Inventors: Chuan Thim Khor, Teluk Intan (MY); Chuan Khye Chai, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 229 days.

(21) Appl. No.: 13/363,133

(22) Filed: Jan. 31, 2012

(51) Int. Cl.
*H03D 3/24* (2006.01)

(52) U.S. Cl.
USPC ............................................. 375/375

(58) Field of Classification Search
USPC ............................................. 375/375
See application file for complete search history.

(56) References Cited

U.S. PATENT DOCUMENTS

| | | | |
|---|---|---|---|
| 6,122,336 A | 9/2000 | Anderson | |
| 7,197,101 B2 | 3/2007 | Glenn et al. | |
| 7,203,259 B2 | 4/2007 | Glenn et al. | |
| 7,315,596 B2 | 1/2008 | Payne et al. | |
| 7,403,584 B2 | 7/2008 | Koenenkamp | |
| 8,571,159 B1 * | 10/2013 | Soh | 375/354 |
| 2003/0123589 A1 | 7/2003 | Glenn et al. | |
| 2003/0123594 A1 | 7/2003 | Glenn et al. | |
| 2005/0147194 A1 | 7/2005 | Koenenkamp | |
| 2005/0180536 A1 | 8/2005 | Payne et al. | |
| 2010/0097071 A1 * | 4/2010 | Lee et al. | 324/537 |

* cited by examiner

*Primary Examiner* — Don N Vo
(74) *Attorney, Agent, or Firm* — Okamoto & Benedicto LLP (57) ABSTRACT

One embodiment relates to an interpolator-based clock and data recovery (iCDR) circuit. The iCDR circuit includes an automatic gain control circuit arranged to generate an interpolation jump size signal when a targeted sampling detection signal is asserted. The targeted sampling detection signal may be asserted when sampling by the phase detector of the iCDR circuit is within a targeted range. The interpolation jump size signal may indicate a number of phase steps to shift an interpolation state signal if a jump is indicated by a filtered feedback signal. Other embodiments and features are also disclosed.

20 Claims, 8 Drawing Sheets

INTERPOLATOR-BASED CLOCK AND DATA RECOVERY WITH REDUCED QUANTIZATION ERROR

BACKGROUND

1. Technical Field

The present invention relates generally to data communications. More particularly, the present invention relates to circuitry for high-speed data links.

2. Description of the Background Art

High-speed serial data links are used to communicate data between devices in a system. Market demands for transceiver data rates for high-speed serial data links continue to increase.

Interpolator-based clock and data recovery (iCDR) has gained wide acceptance for high-speed serial data links. However, iCDR circuits are prone to substantial quantization error due to its digital architecture. The random nature of this type of jitter leads to a substantial amount of eye closure.

SUMMARY

One embodiment relates to an interpolator-based clock and data recovery (iCDR) circuit. The iCDR circuit includes an automatic gain control circuit arranged to generate an interpolation jump size signal when a targeted sampling detection signal is asserted. The targeted sampling detection signal may be asserted when sampling by the phase detector of the iCDR circuit is within a targeted range.

Another embodiment relates to a method for clock and data recovery from an incoming data signal. A feedback signal may be generated which is responsive to a phase of an incoming data signal relative to a recovered clock signal, and the feedback signal may be filtered so as to generate a filtered feedback signal. An interpolation state signal may be generated which is responsive to the filtered feedback signal and an interpolation jump size signal, and the recovered clock signal may be generated by using the interpolation state signal to interpolate between a pair of reference clock signals of different phase. The interpolation jump size signal may be generated when a targeted sampling detection signal is asserted.

Other embodiments and features are also disclosed.

DETAILED DESCRIPTION

Interpolator-based clock and data recovery (iCDR) offers high portability and scalability across different process technologies. In addition, iCDR allows the sharing of phase-locked loop (PLL) circuits across multiple lanes which provides for high efficiency use of power and chip area. The digital nature of the architecture, except for the phase interpolator, facilitates efficient of place-and-route (PnR) for power and area optimizations.

However, in contrast to analog-based clock and data recovery, iCDR circuits suffer from the following drawbacks. First, quantization errors are nearly unavoidable. Even when the iCDR loop is in a locked state, jitter at the edges of the input data (i.e. quantization error) generally causes the phase detector (sampler) to output early and late signals which are, in effect, randomly distributed. As a result, the recovered clock signal will generally include highly random dither jitter. In other words, the phase of the recovered clock typically shifts up and down, dithering between two adjacent phases, even when the iCDR is locked.

Second, the phase correction has a relatively long latency because the feedback signal takes time to travel through the relatively long path around the iCDR loop. The relatively long latency of the iCDR makes it possible, in some instances, for the recovered clock to dither more than plus or minus one phase step of the phase interpolator. In other words, the loop latency may increase or aggravate the sampling phase error.

The present disclosure provides an innovative iCDR circuit architecture that counteracts the above-recited drawbacks. Advantageously, the iCDR circuit disclosed herein reduces dither jitter caused by quantization error. In addition, the effective gain of the phase interpolator is automatically controlled so as to compensate for the loop latency.

Figure 1:
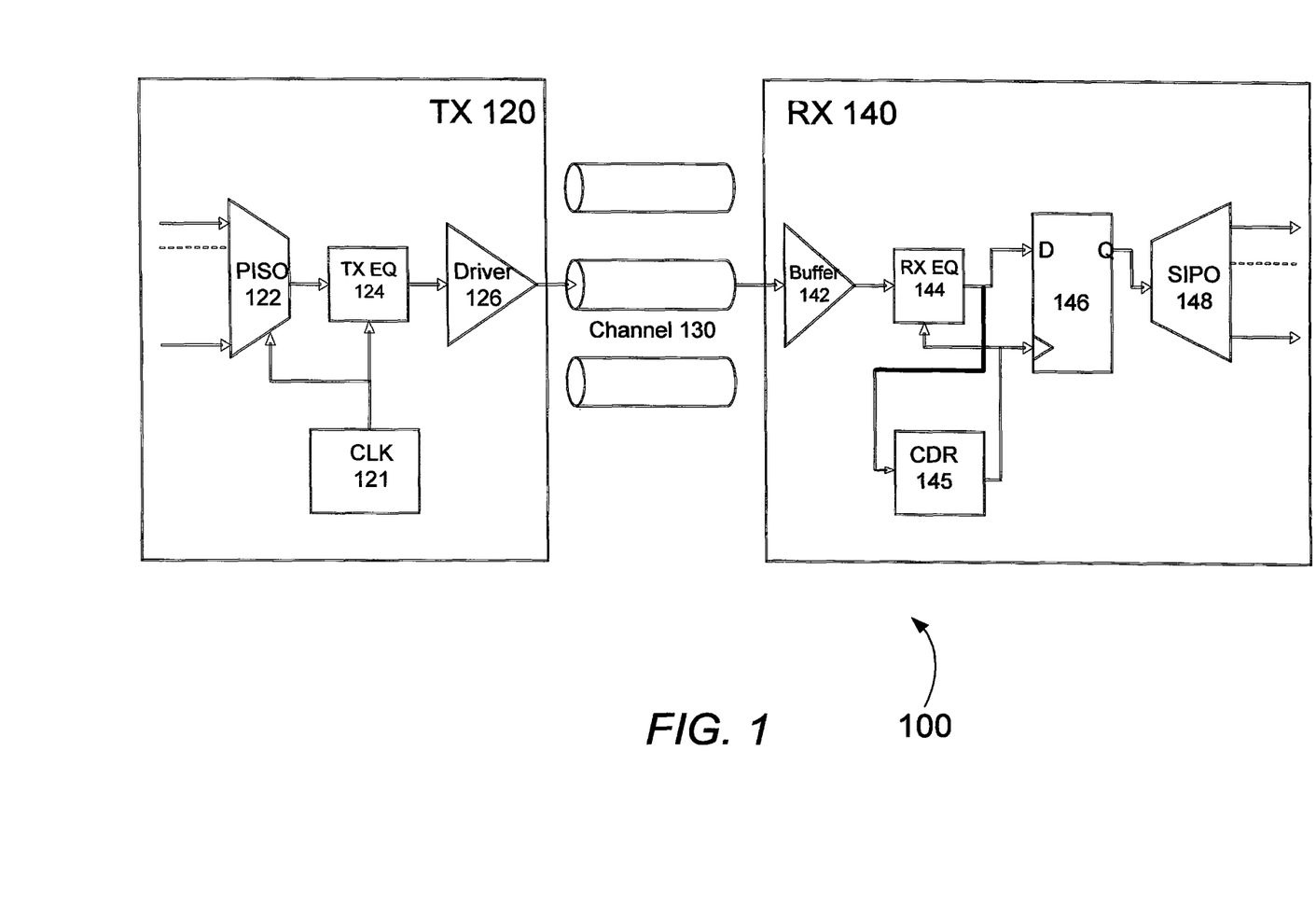
FIG. 1 is a diagram of a communication link in accordance with an embodiment of the invention.

FIG. 1 is a diagram of a communication link in accordance with an embodiment of the invention. As shown in FIG. 1, a communication link is generally composed of a transmitter (TX) 120, a receiver (RX) 140, and a communication channel (CH) 130 that is located in between the transmitter and the receiver.

The TX 120 may include a parallel-in-serial-out (PISO) circuit 122. The PISO (serializer) circuit 122 is configured to receive parallel data signals and convert it to a serial data signal. For example, the transmitter 120 may be part of an integrated circuit, and the parallel data signals may be provided by a communication protocol module in the integrated circuit.

The serial data signal may be adjusted by a transmitter equalizer (TX EQ) circuit 124. In one embodiment, the TX EQ circuit 124 may implement a finite impulse response (FIR) equalization that pre-distorts the transmitted signal to compensate for signal distortion in the channel 130. Clock generator (CLK) circuit 121 may utilize a phase locked loop circuit to provide a clock signal to the PISO 122 and TX EQ 124 circuits. The output from the TX EQ 124 circuit may be provided to a driver circuit 126. The driver circuit 126 may be configured to transmit the serial data signal over the channel 130.

The channel 130 communicates the serial data signal from the transmitter 120 to the receiver 140. The channel 130 may use multiple lanes to communicate the serial data signal.

The receiver 140 may be configured to receive the transmitted serial data signal from the multiple-lane channel into buffer circuitry 142. The buffer circuitry 142 may output the received serial data signal to receiver equalization (RX EQ) circuit 144. The RX EQ circuit 144 may be configured to perform one or more equalizations, as described further herein, to compensate for high-frequency signal loss in the channel. The RX EQ circuit 144 may output an "equalized" serial data signal to both a clock data recovery (CDR) circuit 145 and to a data input of a latch circuit 146.

The CDR circuit 145 may use a PLL to recover the clock signal from the serial data signal. The recovered clock signal may be provided to clock inputs of the RX EQ circuit 144 and to a latch circuit 146. In accordance with an embodiment of the invention, the CDR circuit may comprise an interpolator-based clock and data recovery (iCDR) circuit 200 as described below in relation to FIG. 2.

The latch circuit 146 may be configured to receive the "equalized" serial data signal from the RX EQ circuit 144 at its data input and to receive the recovered clock signal from the CDR circuit 145 at its clock input. The latch circuit 146 outputs the regenerated serial data signal to a serial-in-parallel-out (SIPO) circuit 148. The SIPO (serializer) circuit 148 is configured to receive a serial data signal and convert it to parallel data signals. The parallel data signals may be provided to other circuitry of the receiving device. For example, the receiving device may be an integrated circuit, and the parallel data signals may be provided to a communication protocol module in the integrated circuit.

Figure 2:
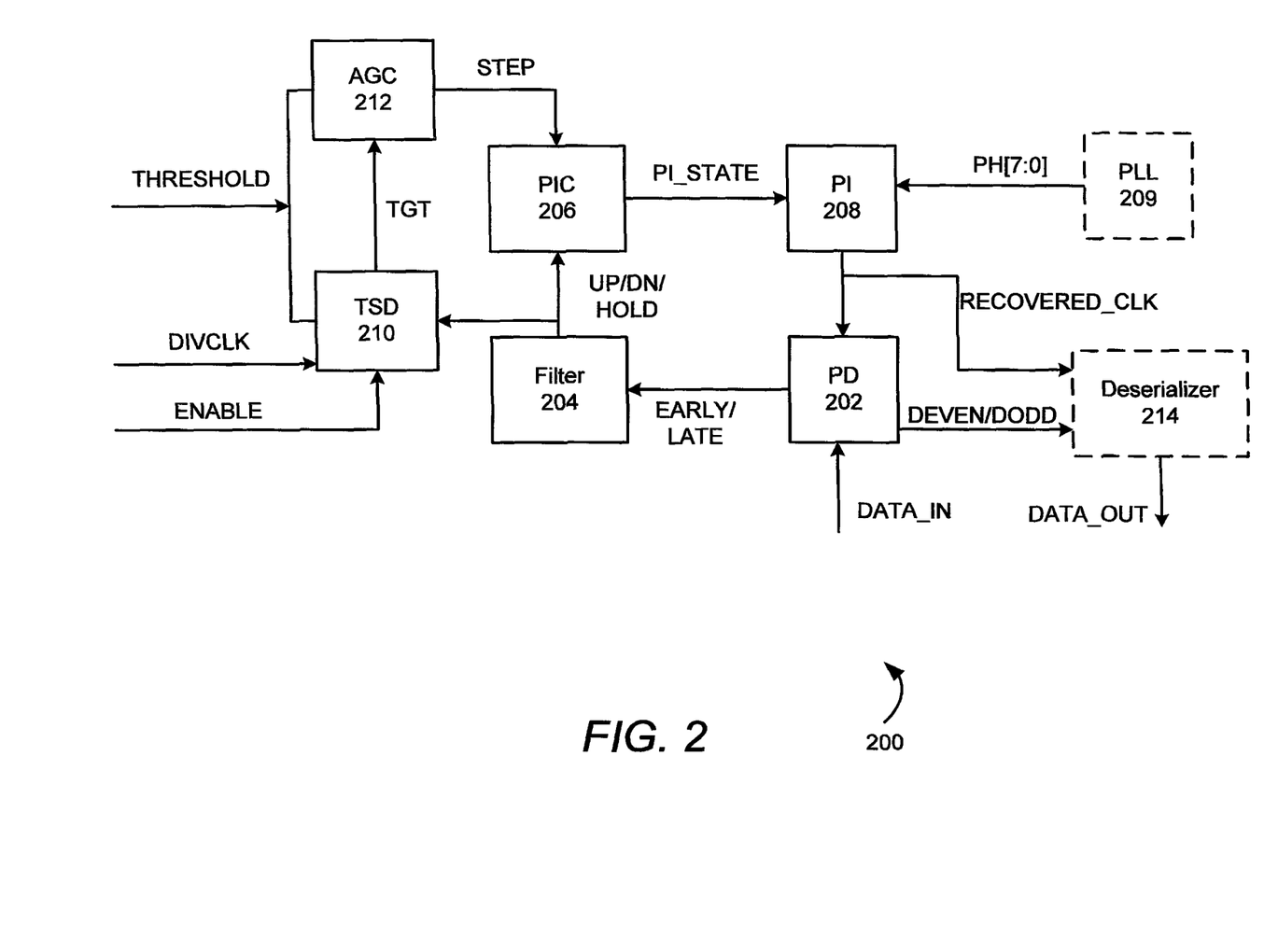
FIG. 2 depicts interpolator-based clock and data recovery circuitry for a serial data channel in accordance with an embodiment of the invention.

FIG. 2 depicts interpolator-based clock and data recovery (iCDR) circuit 200 for a serial data channel in accordance with an embodiment of the invention. As shown, the iCDR circuit 200 includes an iCDR loop that is formed by a phase detector (PD) 202, a filter 204, a phase interpolator controller (PIC) 206, and a phase interpolator (PI) 208.

In accordance with an embodiment of the invention, the iCDR circuit 200 may also include a targeted sampling detector (TSD) 210 and an automatic gain controller (AGC) 212. As described further below, these additional circuits may be coupled to the iCDR loop and advantageously utilized to reduce dither jitter and compensate for the loop latency.

The PD 202 may be configured to receive an incoming serial data signal (DATA_IN) that may be at a data rate of multiple gigabits per second, for example. The PD 202 may be configured to sample the input data signal to determine the position of a recovered clock (RECOVERED_CLK) with respect to the input data signal. The recovered clock may be generated by the PI 208. If the recovered clock is leading the input data signal, then an EARLY signal may be asserted (set to high); and, if the recovered clock is lagging the input data signal, then a LATE signal may be asserted (set to high).

The filter 204 receives the EARLY/LATE feedback signals from the PD 202. The filter 204 may be arranged, for example, to use a counter circuit to compensate for the latency of the CDR loop and to reduce loop dithering. In one implementation, the filter 204 may assert either an up signal, a down signal, or a hold signal (UP/DN/HOLD).

The UP/DN/HOLD signal may be received by the PIC 206. The PIC 206 may be arranged to generate an interpolator control signal based on the UP/DN/HOLD signal. The interpolator control signal may control the phase interpolator 224 to shift the phase of the recovered clock up or down or to hold (i.e. not shift) the current phase of the recovered clock. In particular, if the recovered clock is consistently early (leading) with respect to the input data signal, then the PIC 206 will receive a DOWN signal and will control the phase interpolator 208 to shift down the phase of the recovered clock. On the other hand, if the recovered clock is consistently late (lagging) with respect to the input data signal, then the PIC 206 will receive an UP signal and will control the phase interpolator 208 to shift up the phase of the recovered clock. Otherwise, if the recovered clock is neither consistently leading or lagging the input data signal, then the PIC 206 will receive a HOLD signal and will hold (not shift) the phase of the recovered clock.

The PI 208 may be arranged to receive a reference clock and generate the recovered clock (RECOVERED_CLK). The reference clock may be received from a phase locked loop (PLL) circuit 209. Note that a single PLL circuit 209 may supply the reference clock to iCDR circuits 200 for multiple channels.

As shown in FIG. 2, the reference clock may include multiple clock signals, PH[0:7], that are offset in phase from each other. The PLL circuit 209 may utilize a delay line to generate the multiple phase-offset clock signals. The PI 208 may generate the recovered clock by interpolation between adjacent phase-offset clock signals of the reference clock.

The recovered clock may be output to both the PD 202 and also to the deserializer 214. The deserializer 214 may also receive the data signal (DEVEN/DODD) from the PD 202. The deserializer 214 may include, for example, the latch circuit 146 and the SIPO 148 of FIG. 1. A parallel data signal (DATA_OUT) may be output from the deserializer 214.

The phase resolution of the recovered clock may be determined by the minimum up/down jump size for the interpolation between the clock signals of the reference clock. This minimum up/down jump size of the PI 208 may be referred to as its phase step. A smaller PI phase step generally corresponds to a higher phase resolution of the recovered clock.

In accordance with an embodiment of the invention, the interpolation state signal (PI_STATE) from the PIC 206 may indicate to the PI 208 which two of the multiple clock signals PH[0:7] to use in generating the RECOVERED_CLK signal and also a phase step location between those two clock signals at which the interpolation is to be performed. In further accordance with an embodiment of the invention, the number of phase steps to shift the phase step location if a jump is indicated by the filtered feedback signal may vary depending on whether or not the sampling is detected to be in a targeted condition. Whether or not the sampling is in a targeted condition may be detected by the TSD 210.

As shown in FIG. 2, the TSD 210 may receive various input signals. The input signals may include, for example, an ENABLE signal, the UP/DN/HOLD signal from the filter 204, a DIVCLK clock signal, and a THRESHOLD signal. The TSD 210 may be enabled or disabled by way of the ENABLE signal. The DIVCLK clock signal may be a timing signal which indicates when to store a bidirectional count of the UP/DN/HOLD signal in a shadow register within the TSD 210, after which the count may be reset. The THRESHOLD signal may be a user-definable multiple bit signal which is used to determine when the bidirectional count is within an acceptable window which is indicative of the targeted sampling. The TGT signal generated by the TSD 210 may indicate whether or not the sampling is detected to be in the targeted condition. One embodiment of the TSD 210 is described further below in relation to FIGS. 3 and 4.

The AGC 212 may be configured to receive the TGT signal from the TSD 210 and also the THRESHOLD signal. The AGC 212 may be configured to generate and output a STEP signal. The STEP signal may indicate to the PIC 206 a number of phase steps to shift the PI_STATE signal when a jump is indicated by the UP/DN/HOLD signal. One embodiment of the AGC 212 is described further below in relation to FIG. 5.

Figure 3:
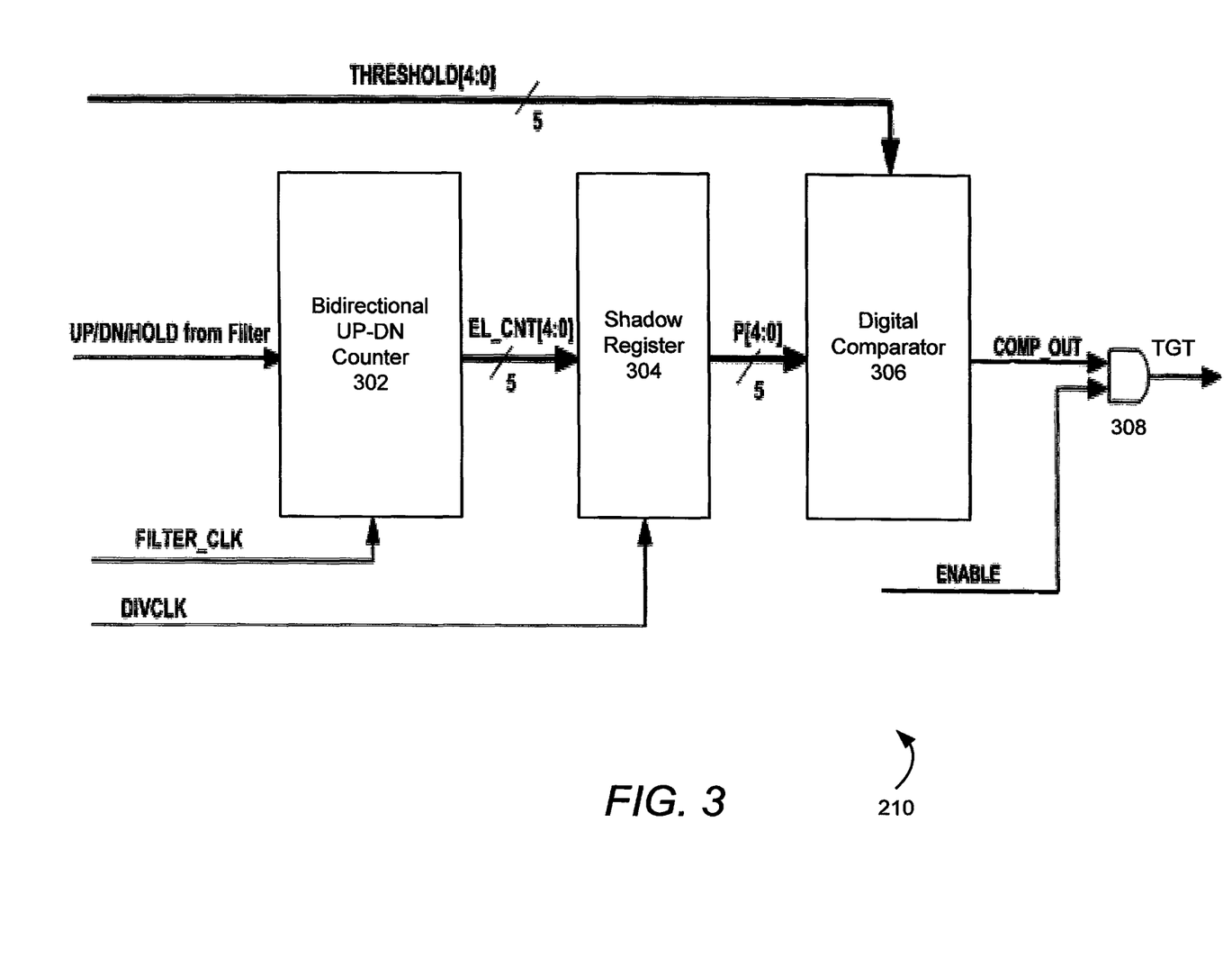
FIG. 3 depicts a targeted sampling detector in accordance with an embodiment of the invention.

FIG. 3 depicts a targeted sampling detector (TSD) 210 in accordance with an embodiment of the invention. When the iCDR loop is performing sampling in a targeted sampling region, the sampling edge will generally dither around the targeted sampling point. Hence, by monitoring the filter's UP/DN/HOLD signal from the filter 204 across a substantial number of cycles, the TSD 210 may determine if the sampling edge is in the targeted condition. As shown, the TSD 210 may include a bidirectional UP-DN counter 302, a shadow register 304, and a digital comparator 306.

The bidirectional UP-DN counter 302 may be configured to receive the UP/DN/HOLD signal, along with a filter clock (FILTER_CLK) signal, from the filter 204. The bidirectional UP-DN counter 302 is configured to take the output of the filter 204, rather than the output of the phase detector 202, because the filtered output is effectively low-pass filtered and thus is expected to provide a more accurate indication of direction.

At every period of the DIVCLK signal, the state of the bidirectional UP-DN counter 302 is provided to the shadow register 304. As shown, the state of the counter 302 may be provided by way of the multi-bit signal EL_CNT[4:0]. The period of the DIVCLK clock signal may be set to be sufficiently long to avoid the issuance of a false targeted sampling indication by the TSD 210.

The shadow register 304 has the function of storing the state from the bidirectional UP-DN counter 302 at times indicated by the DIVCLK clock signal (for example, at an edge in the DIVCLK signal). The stored state may be output by the shadow register 304 in the multi-bit output signal P[4:0].

Whenever the output of the shadow register 304 is updated (i.e. at every DIVCLK period), the digital comparator 306 may compare the current UP-DN counter state against the multi-bit THRESHOLD[4:0] signal. The count value indicated by the THRESHOLD[4:0] signal may be set by the user, for example, during configuration of the integrated circuit with the receiver.

In accordance with one embodiment of the invention, the digital comparator 306 may arranged such that, if the binary number indicated by P[4:0] is less than the binary number indicated by THRESHOLD[4:0], then the sampling phase may be determined to be within the targeted window. Otherwise, if the binary number indicated by P[4:0] is greater than or equal to the binary number indicated by THRESHOLD[4:0], then the sampling may be determined to be outside the targeted (or acceptable) window. If the sampling phase is determined to be within the targeted (or acceptable) window, then the digital comparator may output COMP_OUT=1 (or true), and if the sampling phase is determined to be outside the targeted (or acceptable) window, then the digital comparator may output COMP_OUT=0 (or false).

In one implementation, a logical AND gate 308 may receive the COMP_OUT signal and the ENABLE signal as inputs and may output the TGT signal. Hence, if the ENABLE signal is 0 (false), such that this feature is disabled, then TGT=0. On the other hand, if the ENABLE signal is 1 (true), such that the feature is enabled, then TGT=COMP_OUT.

Figure 4:
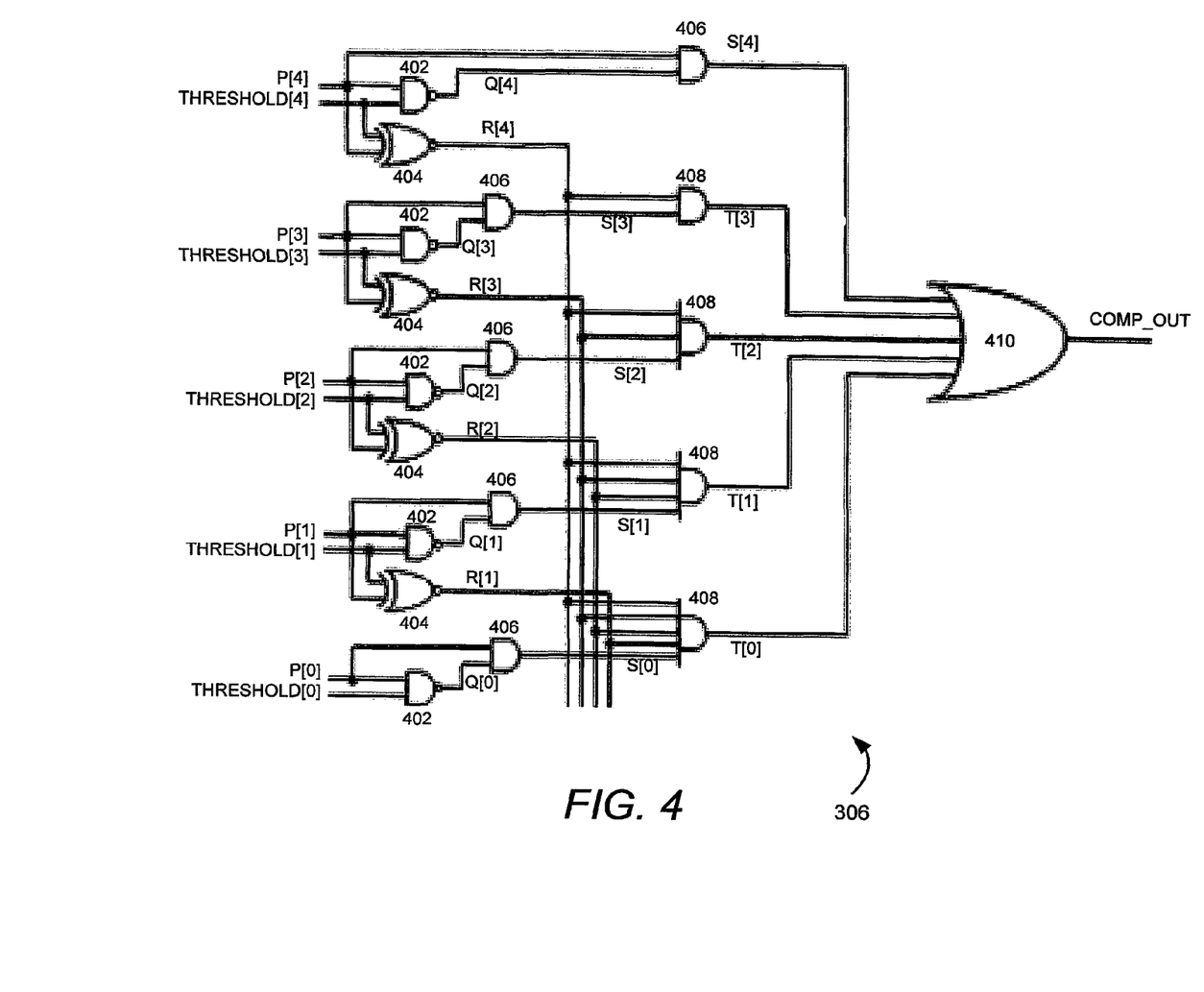
FIG. 4 depicts a digital comparator for a sampling detector in accordance with an embodiment of the invention.

FIG. 4 depicts a digital comparator 306 for a sampling detector in accordance with an embodiment of the invention. In the particular embodiment depicted, the digital comparator 306 compares a five-bit output signal P[4:0] from the shadow register 304 against a five-bit threshold signal THRESHOLD [4:0].

As shown, the digital comparator 306 may include a plurality of NAND logic gates 402, a plurality of XNOR (exclusive-NOR) logic gates 404, a plurality of "primary" AND logic gates 406, a plurality of "secondary" AND logic gates 408, and an OR logic gate 410. Note that, for the input signals P[4:0] and THRESHOLD[4:0], the least significant bits are P[0] and THRESHOLD[0], and the most significant bits are P[4] and THRESHOLD[4].

Each of the five NAND gates 402 is configured to receive the two input signals: P[n] and THRESHOLD[n], where n is 0, 1, 2, 3, or 4. In other words, each NAND gate 402 receives a bit output from the shadow register and a corresponding bit of the threshold signal. The output of the five NAND gates 402 may be designated as Q[n], where n=0, 1, 2, 3, or 4.

Each of the four XNOR gates 404 is configured to receive the two input signals: P[n] and THRESHOLD[n], where n is 1, 2, 3, or 4. In other words, each XNOR gate 404 receives a bit output from the shadow register and a corresponding bit of the threshold signal. The output of the four XNOR gates 404 may be designated as R[n], where n=1, 2, 3, or 4.

Each of the five primary AND gates 406 is configured to receive the two input signals: P[n] and Q[n], where n=0, 1, 2, 3, or 4. The output of the five primary AND gates 406 may be designated as S[n], where n=0, 1, 2, 3, or 4.

A first (highest in the figure) secondary AND gate 408 is configured to receive the two input signals, S[3] and R[4], and to output the signal T[3]. A second (second from top in the figure) secondary AND gate 408 is configured to receive the three input signals S[2] and R[4:3] and to output the signal T[2]. A third (second from bottom in the figure) secondary AND gate 408 is configured to receive the four input signals, S[1] and R[4:2] and to output the signal T[1]. A fourth (lowest in the figure) second secondary AND gate 408 is configured to receive the five input signals, S[0] and R[4:1] and to output the signal T[0].

Finally, the OR gate 410 is configured to receive the five input signals S[4] and T[3:0] and to output the COMP_OUT signal. The COMP_OUT signal may be output from the digital comparator 306.

Figure 5:
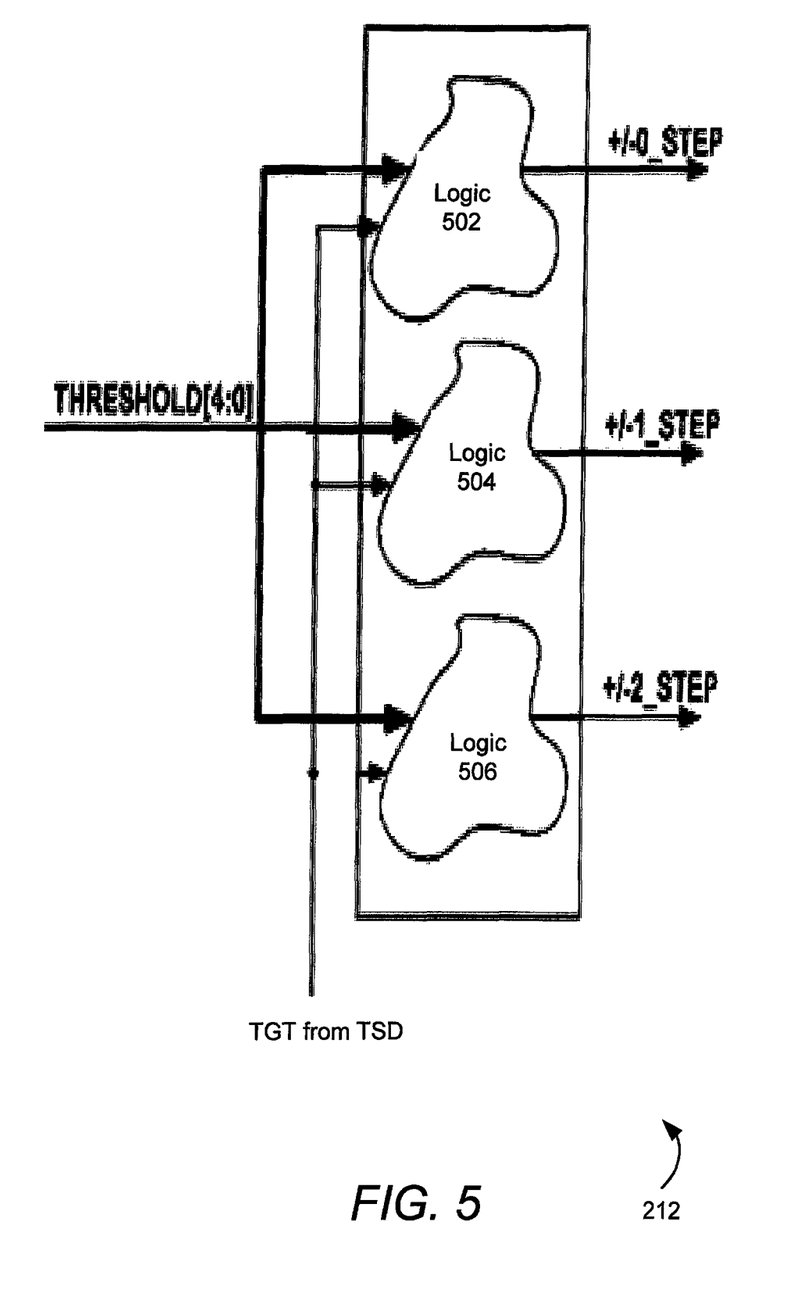
FIG. 5 illustrates an automatic gain controller in accordance with an embodiment of the invention.

FIG. 5 illustrates an automatic gain controller (AGC) 212 in accordance with an embodiment of the invention. As shown, the AGC 212 may include a first logic circuit 502, a second logic circuit 504, and a third logic circuit 506. Each of these combinatorial logic circuits may be configured to receive the TGT signal from the TSD 210 and the multi-bit THRESHOLD signal. Other embodiments may include further logic circuits.

In accordance with an embodiment of the invention, once the TGT signal from the TSD 210 is asserted, the allowable jump size (in terms of a number of phase steps per jump) for shifts in the phase interpolation may be set according to the output of the logic circuits in the AGC 212.

In the embodiment depicted in FIG. 5, the first logic circuit 502 may be configured to output a logical one (TRUE) for the +/−0 STEP signal when the THRESHOLD signal is in a lowest range, and otherwise output a logical zero (FALSE). The +/−0 STEP signal may indicate whether or not the up/down jump size should be set to zero steps, such that the phase interpolation does not shift during the targeted condition. Setting the jump size to zero steps is equivalent to freezing the phase interpolation.

The second logic circuit 504 may be configured to output TRUE for the +/−1 STEP signal when the THRESHOLD signal is in a middle range, and otherwise output a FALSE. The +/−1 STEP signal may indicate whether or not the up/down jump size should be set to a single phase step.

The third logic circuit 506 may be configured to output TRUE for the +/−2 STEP signal when the THRESHOLD signal is in a highest range, and otherwise output a FALSE. The +/−2 STEP signal may indicate whether or not the up/down jump size should be set to two phase steps. In other embodiments, further logic circuits may be included to provide further gain control signals which indicate that the jump size may be other numbers of phase steps.

For example, in one particular implementation, the +/−0 STEP signal may be TRUE when THRESHOLD[4:0] is within the binary range from 00000 to 00101 (inclusive), and otherwise may be FALSE. The +/−1 STEP signal may be asserted as TRUE when THRESHOLD[4:0] is within the binary range from 00110 to 10101 (inclusive), and otherwise may be asserted as FALSE. Finally, the +/−2 STEP signal may be asserted as TRUE when THRESHOLD[4:0] is within the binary range from 10110 to 11111 (inclusive), and otherwise may be asserted as FALSE. This particular implementation is shown below in Table 1.

TABLE 1

| THRESHOLD[4:0] | Enabled Jump Size |
| --- | --- |
| 00000 through 00101 | +/− 0 step |
| 00110 through 10101 | +/− 1 step |
| 10110 through 11111 | +/− 2 step |

The gain control signals (i.e. the +/−0 STEP, +/−1 STEP, and +/−2 STEP signals) from the AGC 212 may be provided to the PIC 206. The PIC 206 may then use the gain control signals to automatically adjust the up/down jump size that is being used.

Figure 6:
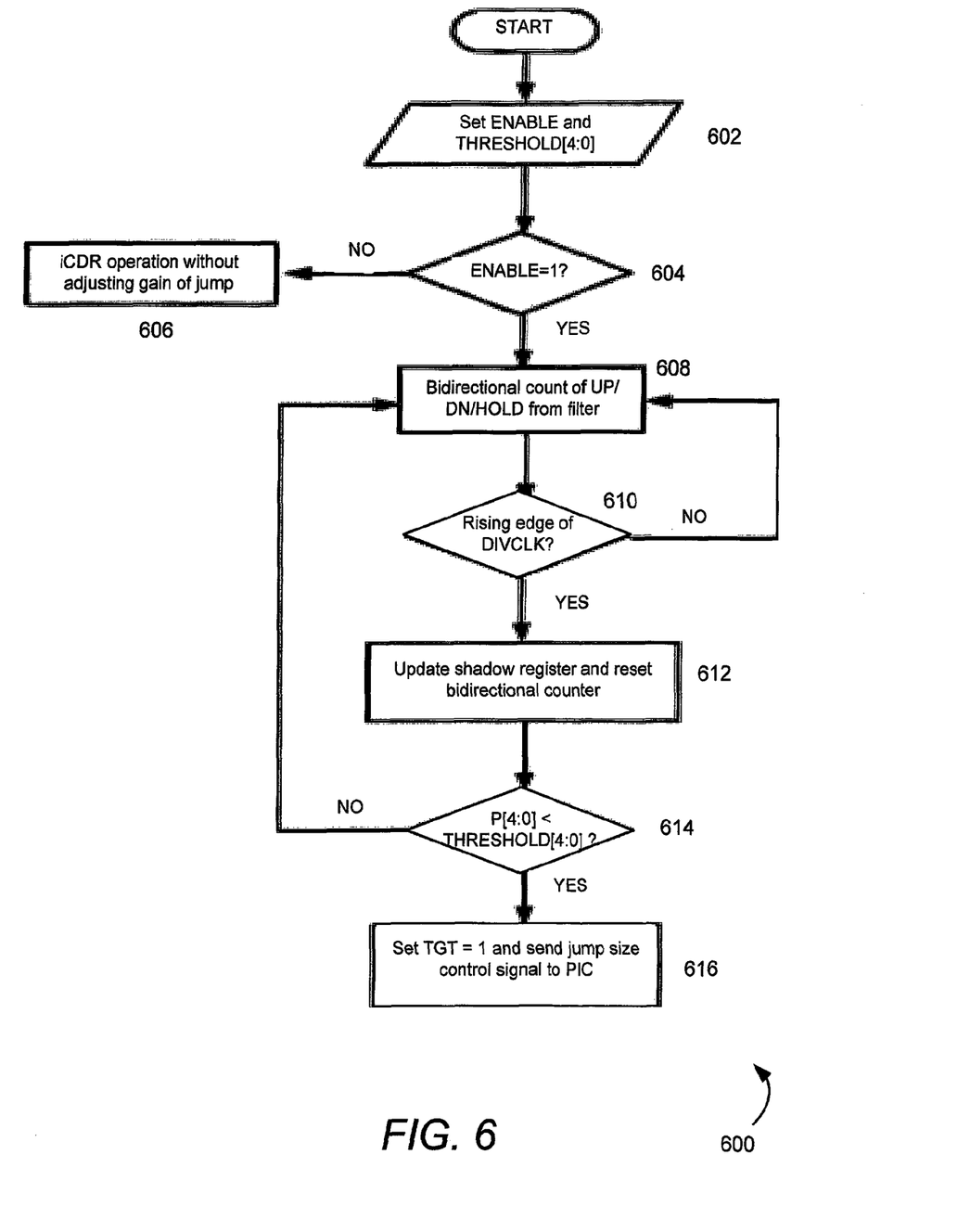
FIG. 6 is a flow chart depicting a method for clock and data recovery in accordance with an embodiment of the invention.

FIG. 6 is a flow chart depicting a method 600 for clock and data recovery in accordance with an embodiment of the invention. As described below, the method 600 may be performed using the circuitry described above.

Per block 602, the ENABLE signal may be set (or reset) so as to enable (or disable) the targeted sampling detection and automatic gain control. In addition, the multi-bit THRESHOLD signal may be programmed or set to a desired value by a user. In general, a higher value for the THRESHOLD signal may correspond to a larger jump size. A larger jump size provides greater loop tracking bandwidth, and the greater loop tracking bandwidth means that the allowable sampling phase window randomization is wider. A smaller jump size provides lower loop tracking bandwidth, and the lower loop tracking bandwidth means that the allowable sampling phase window randomization is smaller.

Per block 604, a determination may be made as to whether or not the ENABLE signal is set to logical one. If ENABLE=0, then, per block 606, the iCDR may operate without adjusting the gain of the jump (i.e. without changing the number of steps per jump). In other words, if ENABLE=0, then the targeted sampling detection and automatic gain control are disabled, and the iCDR may operate in a non-targeted sampling mode. In the non-targeted sampling mode, the jump size may be a fixed number of phase steps. The fixed number of phase steps may vary depending on the implementation and may be, for example, two, three, four, or more phase steps.

On the other hand, if ENABLE=1, then the targeted sampling detection and automatic gain control are enabled. As such, the method 600 proceeds to block 608. Per block 608, the TSD 210 may perform a bidirectional count based on the up, down, and hold signals received from the filter 204. As indicated by block 610, the bidirectional count may continue until a predetermined edge (such as a rising edge) of the DIVCLK signal is received.

When the predetermined edge of the DIVCLK is received, then, per block 612, the shadow register may be updated, and the bidirectional counter may be reset. Per block 614, upon updating of the shadow register, a determination may be made as to whether or not the value of the P signal from the shadow register is less than the value of the THRESHOLD signal. For example, if the P and THRESHOLD signals are both 5-bit signals, then a determination is made as to whether P[4:0]<THRESHOLD[4:0].

If value of P is greater than or equal to the value of THRESHOLD, then the method 600 loops back to block 608.

In that case, the bidirectional count is performed until the predetermined edge of the DIVCLK signal as described above. On the other hand, if the value of P is less than the value of THRESHOLD, then the TGT signal may be set to logical one, such that the jump size control signal may be generated by the AGC 212 and then sent to the PIC 206.

The jump size control provided by the apparatus and methods disclosed herein may be used advantageously to control the observed jitter in the recovered clock signal. This capability is demonstrated, for example, by the trial results shown below in Table 2.

TABLE 2

| Jump Size | RMS Jitter (in picoseconds) |
| --- | --- |
| +/− 1 step | 5.6 |
| +/− 2 steps | 10.7 |
| +/− 3 steps | 14 |

As seen in Table 2, the root mean square (RMS) jitter is shown to be lower when the jump size during targeted sampling is smaller. In effect, there is a noise floor that increases with a larger jump size and decreases with a smaller jump size.

Figure 7:
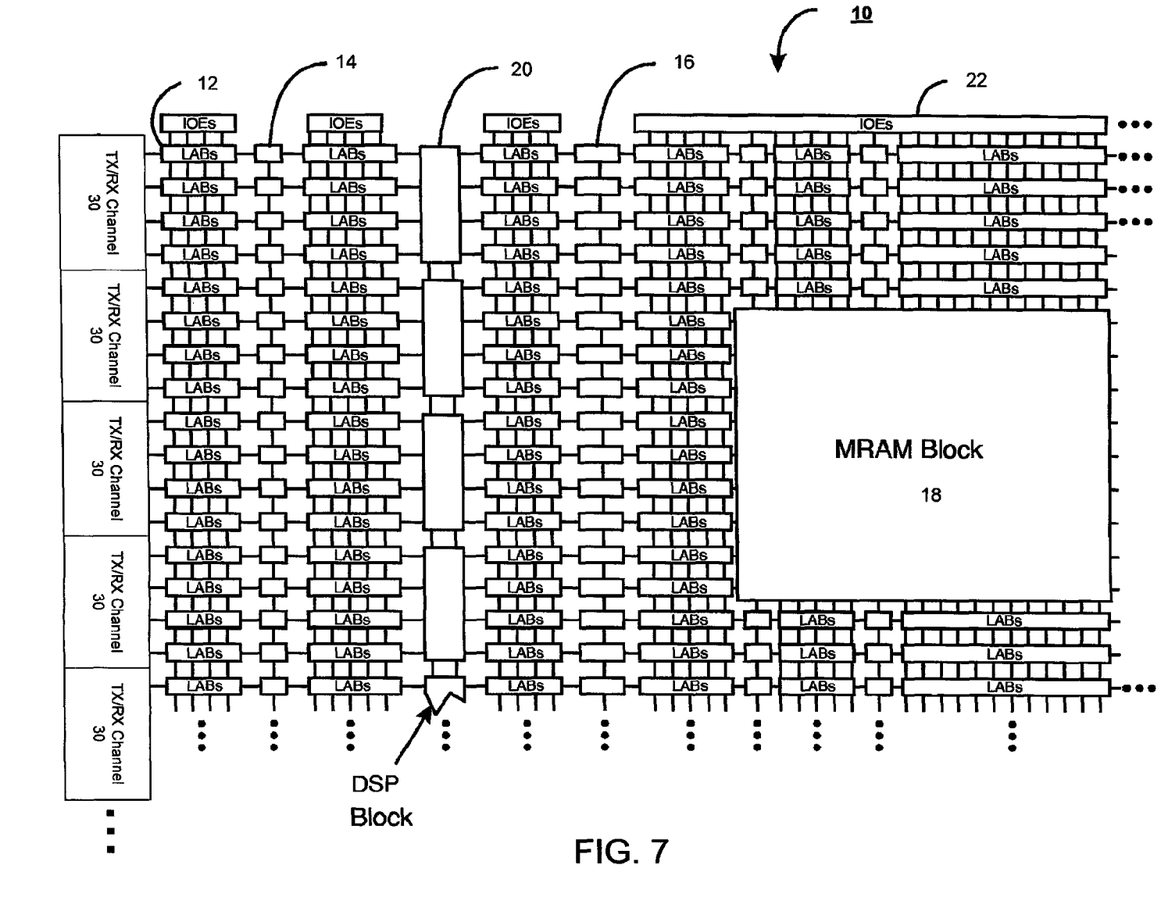
FIG. 7 is a simplified partial block diagram of a field programmable gate array (FPGA) that can include aspects of the present invention.

FIG. 7 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, a receiver having iCDR circuitry with reduced quantized error as described herein.

It is to be understood that FPGA 10 is described herein for illustrative purposes only and that the present invention can be implemented in many different types of PLDs, FPGAs, and ASICs.

Figure 8:
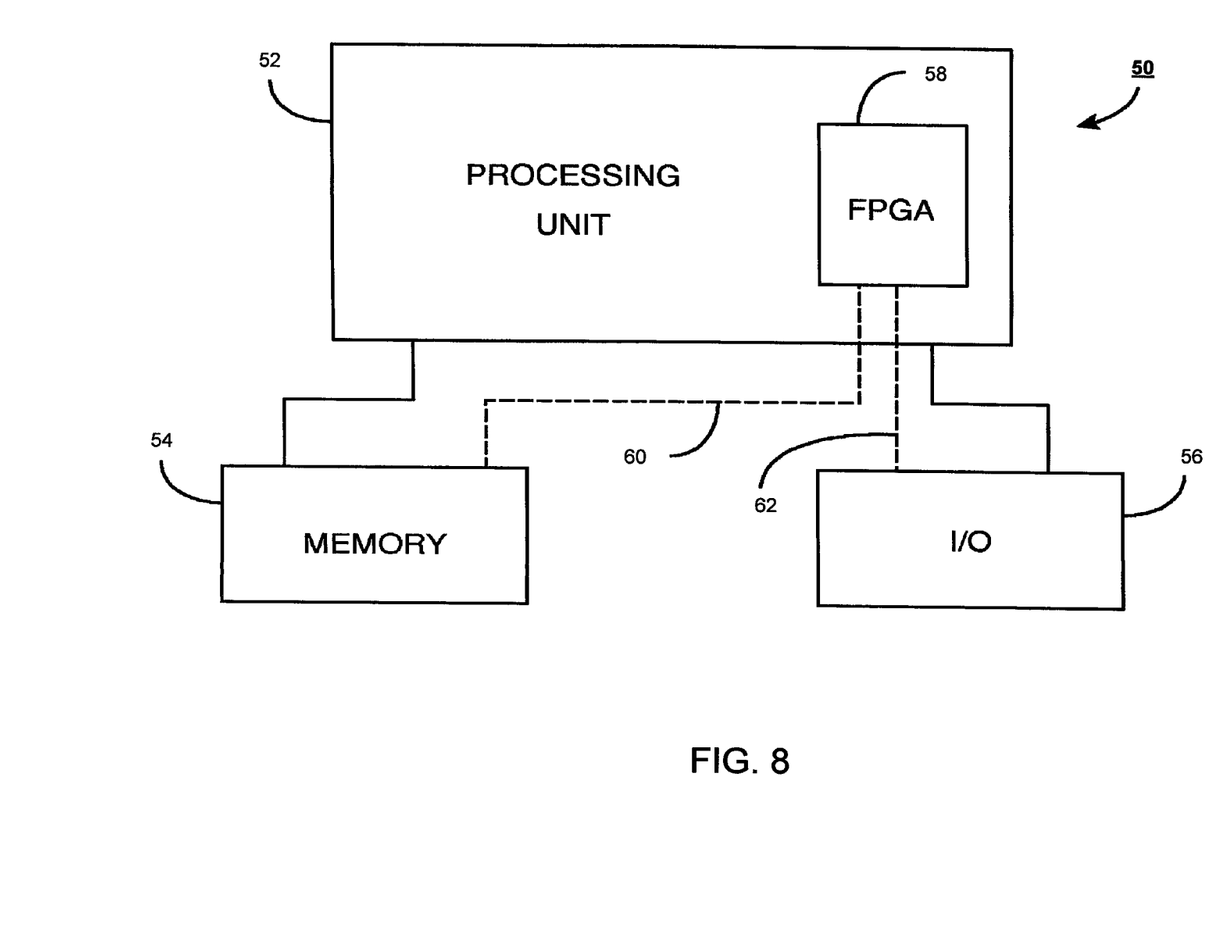
FIG. 8 is a block diagram of an exemplary digital system that can employ techniques of the present invention.

The present invention can also be implemented in a system that has a FPGA as one of several components. FIG. 8 shows a block diagram of an exemplary digital system 50 that may embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A clock and data recovery circuit comprising:
a phase detector circuit arranged to generate a feedback signal which is responsive to a phase of an incoming data signal relative to a recovered clock signal;
a filter circuit arranged to filter the feedback signal so as to generate a filtered feedback signal;
a phase interpolator controller arranged to generate an interpolation state signal responsive to the filtered feedback signal and an interpolation jump size signal;
a phase interpolator arranged to generate the recovered clock signal by using the interpolation state signal to interpolate between reference clock signals of different phase; and
an automatic gain control circuit arranged to generate the interpolation jump size signal when a targeted sampling detection signal is asserted.

2. The circuit of claim 1, wherein the interpolation jump size signal indicates a number of phase steps to shift the interpolation state signal if a jump is indicated by the filtered feedback signal.

3. The circuit of claim 2, wherein the number of phase steps is determined by a threshold count.

4. The circuit of claim 3, further comprising:
a targeted sampling detector arranged to receive the filtered feedback signal and assert the targeted sampling detection signal when sampling by the phase detector circuit is determined to be within a targeted range.

5. The circuit of claim 4, further comprising:
a bidirectional counter in the targeted sampling detector, wherein the bidirectional counter is arranged to maintain a count based on the filtered feedback signal.

6. The circuit of claim 5, further comprising:
a shadow register in the targeted sampling detector, wherein the shadow register is arranged to be updated periodically with the count from the bidirectional counter, and wherein the bidirectional counter is further arranged to be reset after the shadow register is updated.

7. The circuit of claim 6, further comprising:
a digital comparator in the targeted sampling detector, wherein the digital comparator is arranged to compare the count from the bidirectional counter against the threshold count to determine whether the sampling by the phase detector circuit is within the targeted range.

8. The circuit of claim 7, wherein the threshold count is configured using electronic programming of the circuit.

9. A method for clock and data recovery from an incoming data signal, the method comprising:
generating a feedback signal which is responsive to a phase of an incoming data signal relative to a recovered clock signal;
filtering the feedback signal so as to generate a filtered feedback signal;
generating an interpolation state signal responsive to the filtered feedback signal and an interpolation jump size signal;
generating the recovered clock signal by using the interpolation state signal to interpolate between reference clock signals of different phase; and
generating the interpolation jump size signal when a targeted sampling detection signal is asserted.

10. The method of claim 9, wherein the interpolation jump size signal indicates a number of phase steps to shift the interpolation state signal if a jump is indicated by the filtered feedback signal.

11. The method of claim 10, wherein the number of phase steps is determined by a threshold count.

12. The method of claim 11, further comprising:
asserting the targeted sampling detection signal when sampling by a phase detector circuit is determined to be within a targeted range.

13. The method of claim 12, further comprising:
maintaining a count bidirectionally based on the filtered feedback signal.

14. The method of claim 13, further comprising:
periodically updating a register with the count and resetting the count.

15. The method of claim 14, further comprising:
comparing the count from the register against the threshold count to determine whether the sampling by the phase detector circuit is within the targeted range.

16. The method of claim 15, wherein the threshold count is configured using electronic programming of the circuit.

17. A receiver for a data link, the receiver comprising:
a buffer circuit arranged to receive an incoming data signal and generate a buffered data signal; and
an interpolator-based clock and data recovery circuit comprising
a phase detector arranged to generate a feedback signal which is responsive to a phase of the buffered data signal relative to a recovered clock signal,
a filter circuit arranged to filter the feedback signal so as to generate a filtered feedback signal,
a phase interpolator controller arranged to generate an interpolation state signal responsive to the filtered feedback signal and an interpolation jump size signal,
a phase interpolator arranged to generate the recovered clock signal by using the interpolation state signal to interpolate between reference clock signals of different phase, and
an automatic gain control circuit arranged to generate the interpolation jump size signal when a targeted sampling detection signal is asserted.

18. The receiver of claim 17, wherein the interpolation jump size signal indicates a number of phase steps to shift the interpolation state signal if a jump is indicated by the filtered feedback signal.

19. The receiver of claim 18, wherein the number of phase steps is determined by a threshold count.

20. The receiver of claim 19, further comprising:
a targeted sampling detector arranged to receive the filtered feedback signal and assert the targeted sampling detection signal when sampling by the phase detector circuit is determined to be within a targeted range.

\* \* \* \* \*